(12) United States Patent  
Farrell

(10) Patent No.: US 7,924,893 B2
(45) Date of Patent: Apr. 12, 2011

(54) METHOD AND SYSTEM FOR SWITCHING OF TUNABLE LASERS

(76) Inventor: Thomas Farrell, Dublin (IE)

( * ) Notice: Subject to any disclaimer, the term of this patent is extended or adjusted under 35 U.S.C. 154(b) by 61 days.

(21) Appl. No.: 12/202,191

(22) Filed: Aug. 29, 2008

(65) Prior Publication Data

US 2009/0059972 A1 Mar. 5, 2009

Related U.S. Application Data

(60) Provisional application No. 60/968,657, filed on Aug. 29, 2007.

(51) Int. Cl.
  *H01S 3/10* (2006.01)
  *H01S 3/13* (2006.01)
  *H01S 5/00* (2006.01)
(52) U.S. Cl. ............ 372/20; 372/29.02; 372/43.01
(58) Field of Classification Search .......... 372/38.1, 372/38.02, 20
  See application file for complete search history.

(56) References Cited

U.S. PATENT DOCUMENTS

| | | | | |
|---|---|---|---|---|
| 6,400,737 | B1 * | 6/2002 | Broutin et al. | 372/20 |
| 6,504,856 | B1 * | 1/2003 | Broberg et al. | 372/38.07 |
| 7,133,428 | B2 * | 11/2006 | Kitaoka et al. | 372/38.02 |
| 2002/0075918 | A1 * | 6/2002 | Crowder | 372/38.02 |
| 2002/0181521 | A1 * | 12/2002 | Crowder et al. | 372/38.02 |
| 2004/0136423 | A1 * | 7/2004 | Coldren et al. | 372/38.02 |
| 2006/0239306 | A1 * | 10/2006 | Donohoe et al. | 372/20 |
| 2007/0258494 | A1 * | 11/2007 | Davies et al. | 372/20 |

* cited by examiner

*Primary Examiner* — Minsun Harvey
*Assistant Examiner* — Phillip Nguyen
(74) *Attorney, Agent, or Firm* — McDonnell Boehnen Hulbert & Berghoff LLP

(57) ABSTRACT

The invention provides a method and laser system for switching from a current operating point to a new operating point of the laser, the laser operating at a particular wavelength and includes a source channel and destination channel. The system switches and locks the output wavelength of a laser at ultra fast time scales (<50 ns) and compensate for degradation in the laser, and thermal transients in the device during the switching to ensure that within a certain time the laser has switched its wavelength to another wavelength within a specific accuracy and is not dependent on the previous wavelength of the laser.

16 Claims, 4 Drawing Sheets

| Channel | 201 | 202 | 203 | 204 | 205 |
|---------|-----|-----|-----|-----|-----|
| 1 | ... | ... | ... | ... | ... |
| 2 | ... | ... | ... | ... | ... |
| ... | | | | | |

# METHOD AND SYSTEM FOR SWITCHING OF TUNABLE LASERS

FIELD

The invention relates to switching of tunable lasers so that the switching time to change the laser from one wavelength to another wavelength may be reduced. The invention is particularly suitable, but not exclusively, for optical communications.

BACKGROUND

The invention relates to a multi-section laser diode that can be switched between different wavelengths, more especially to a laser system comprising a control circuit that enables a multi-section laser diode to be switched rapidly between different wavelengths.

A typical multi-section diode laser is a three-section tunable distributed Bragg reflector (DBR) laser. Other types of multi-section diode lasers are the sampled grating DBR (SG-DBR) and the superstructure sampled DBR (SSG-DBR) which both have four sections. A further multi-section diode laser is the grating-assisted coupler with rear sampled or superstructure grating reflector (GCSR), which also has four sections.

FIG. 1 is a basic schematic drawing of a SG-DBR 10. The laser comprises back and front reflector sections 2 and 8 with an intervening gain or active section 6 and phase section 4. An antireflection coating 9 is usually provided on the front and/or rear facet of the chip to avoid facet modes. The back and front reflectors take the form of sampled Bragg gratings 3 and 5. The pitch of the gratings of the back and front reflectors is slightly different, to provide a Vernier tuning effect through varying the current supplied to these sections.

The phase section, for example by refractive index changes induced by varying the carrier density in this section. A more detailed description of the SG-DBR and other tunable multi-section diode lasers can be found in PCT patent publication number WO03/023916 entitled "Multi-section Diode Lasers".

Multi-section diode lasers may be useful in wavelength division multiplexed (WDM) systems. Example applications are as transmitter sources, as wavelength converters in optical cross connects (OXCs) and for reference sources in heterodyne receivers. Typically, WDM systems have channel spacings conforming to the International Telecommunications Union (ITU) standard G692, which has a fixed point at 193.1 THz and inter-channel spacings at an integer multiple of 50 GHz or 100 GHz. An example dense WDM (DWDM) system could have a 50 GHz channel spacing and range from 191 THz to 196 THz (1525-1560 nm). One of the benefits of multi-section diode lasers is their wavelength tunability. Each section of the laser diode is supplied with a drive current, and the lasing wavelength is a function of the set of drive currents, this function generally being quite complex. Setting the output wavelength of such a laser is thus usually performed by a sophisticated microprocessor controlled control system. As well as the fact that there is a complex relation between output wavelength and the set of drive currents, there is the additional factor that wavelength switching of the laser destroys its thermal equilibrium, which results in transient wavelength instabilities until thermal equilibrium is reached at the new set of drive currents. The time needed for temperature stabilisation can be quite long.

The transient thermal properties consist of two main effects. A first effect is that, directly after the laser is switched, the thermal gradient across the device to the heat sink upon which it is mounted will be different to that measured at steady state operating conditions for these currents, due to a different heating level generated in the laser as the currents are different. This steady state temperature gradient will reassert itself over a period measured in a timescale from a few hundred nanoseconds to tens of microseconds. Because the device is at a different temperature during this period some temperature tuning of the wavelength occurs. For a positive (negative) change in tuning current the change in temperature will be such that the device is initially colder (hotter) than at equilibrium for those currents and some time will pass before the extra current dissipates enough heat energy to change this. During that period the device will be colder (hotter) than expected so a blue (red) shift from the expected output wavelength will occur.

A second effect takes place over a much longer timescale. The laser is thermally connected to a heat sink of finite thermal mass which has a temperature controller maintaining its temperature. The temperature controller cannot react instantaneously to a change in temperature, which means that with an increase (decrease) in bias current, the heat sink will heat up (down). This in turn means that for a given temperature gradient the device will have a different temperature, because the temperature the gradient is referenced from will be different. This temperature change results in the temperature of the device overshooting and going higher (lower) than would be normal for those currents. This effect may persist until the temperature controller returns the heat sink to its normal temperature, which may take 1-1.5 seconds.

SUMMARY

To overcome the problems associated with transient (and non-transient) thermal effects, and also any other effects that cause the wavelength to deviate from the intended wavelength for a predetermined set of drive currents, a wavelength measuring system can be included which supplies measurements of the output wavelength to the control system. The laser drive current can then be adjusted in a feedback loop to provide locking of the output to the desired output wavelength. Feedback loops of this type can adjust and correct the wavelength error of the laser but typically require an amount of time to perform this compensation. This time to perform the compensation may be problematic as the switching time of the laser is dependent on the magnitude of the wavelength error and the bandwidth of the feedback loop that can result in inefficient use of the laser.

There is therefore a need to provide a system and method that can reduce the initial wavelength error that will significantly reduce the switching time of the laser.

The present invention provides a laser system for switching from a current operating point to a new operating point of the laser, the laser of the laser system operating at a particular wavelength. The laser system comprises:
  (i) a laser configured to operate at a plurality of wavelengths, and while operating at a given one of the wavelengths, to operate at a plurality of operating points, wherein a plurality of settings define, at least in part, operation of the laser;
  (ii) a feedback loop configured to adjust one or more of the settings of the laser based on a reference value;
  (iii) a source channel and a destination channel;
  (iv) a processor and program instructions that are stored in data storage and executable by the processor to:
    transfer one or more adjustments from the source channel to the destination channel, wherein the one or more adjustments comprise adjustments caused to the settings of the laser by the feedback loop; and utilise a compensation factor based on the source and destination channels to adjust one or more destination channel settings to thereby switch from a current operating point of the laser to a new operating point of the laser.

The system may switch and lock the output wavelength of a laser at ultra fast time scales (<50 ns) and may compensate for degradation in the laser, and thermal transients in the device during the switching, thus helping the laser to switch its wavelength to another wavelength within a specific accuracy, and within a certain time. The system may provide thus functionality independent from the previous wavelength of the laser. This involves controlling the wavelength of a laser so that its output wavelength may switch in an ultra-fast manner.

It will be appreciated that in the context of the present invention, the operating point may be provided by the source channel and the new operating point may be provided by the destination channel.

The present invention may help deal with the thermal and optical properties of the laser that cause the output wavelength of the laser to drift from very short to very long time scales and may include a compensation factor for numerous thermal effects so that the switching time may be reduced. Preferably, the feedback loop is a digital feedback loop or an analogue feedback loop. Further, a wavelength reference is provided by means of a Fabry Perot etalon to provide a correction factor for the feedback loop. Yet further, the settings of the laser effected by the feedback loop is the phase section of the laser. In particular, a means to adjust the destination settings based on a source channel of the laser may be provided.

In one embodiment the feedback loop correction may operate to measure the amount of compensation provided by the feedback loop before the laser switch to provide a compensation factor for use in switching the laser to the new operating point. It will be appreciated that while locking the wavelength of the channel a correction value is obtained. This correction value may need to be adjusted so that the same correction factor can be applied to the new channel, and a compensation factor is used to convert this value and is an important aspect of implementing the invention. It will be appreciated that the laser system and others can be integrated with other functions such as optical amplifiers, optical modulators without limiting the scope of this invention.

Preferably, the compensation factor compensates for different bias conditions of the laser.

In an exemplary embodiment, there is provided a lookup table stores a series of values for each channel of wavelength of the laser, said values comprising one or more of the following: bias settings, fine wavelength control setting, source compensation factor, destination compensation factor or channel conversion factor.

In a further embodiment, the laser system may include program instructions to determine the new operating point. In particular the program instructions may executable to:
(i) obtain the source compensation factor for the current channel and sum the source compensation factor with the destination compensation factor for a new channel; and
(ii) multiply the sum of the source compensations factor and destination compensation factor by the channel compensation factor of the new channel and add the resulting value to the fine wavelength control setting of the new channel.

In a further embodiment there is provided a method of switching a laser from a current operating point to a new operating point, wherein the laser is operating at a particular wavelength. The operation of the laser may generally be defined, at least in part, by one or more settings of the laser. The method comprises:
(i) enabling a feedback loop for adjusting one or more of the settings of the laser based on a reference value;
(ii) transferring one or more adjustments caused to the one or more settings of the laser by the feedback loop from a source channel to a destination channel; and
(iii) utilising a compensation factor based on the source channel and the destination channel to adjust one or more destination channel settings.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which:—

DETAILED DESCRIPTION

Figure 1:
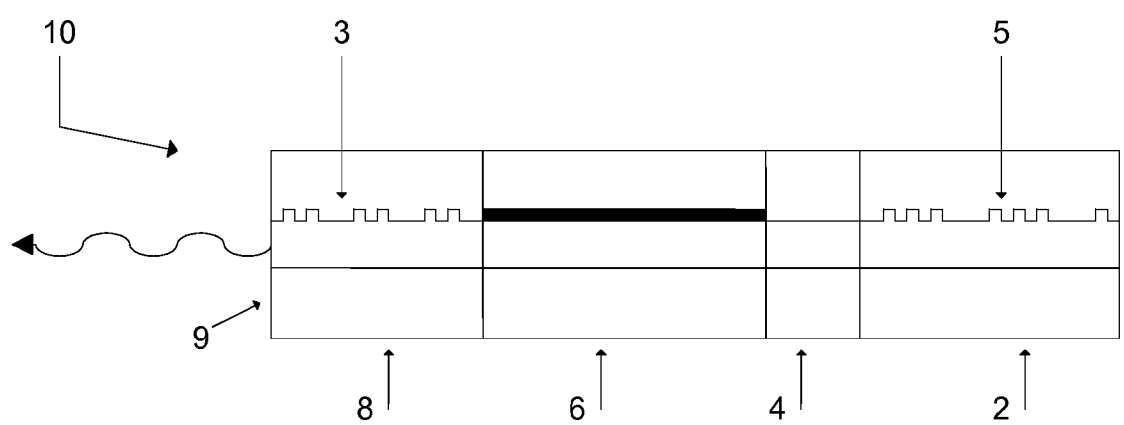
FIG. 1 illustrates a schematic of the implementation of a typical feedback loop for a multi-section laser.
Figures 2, 3:
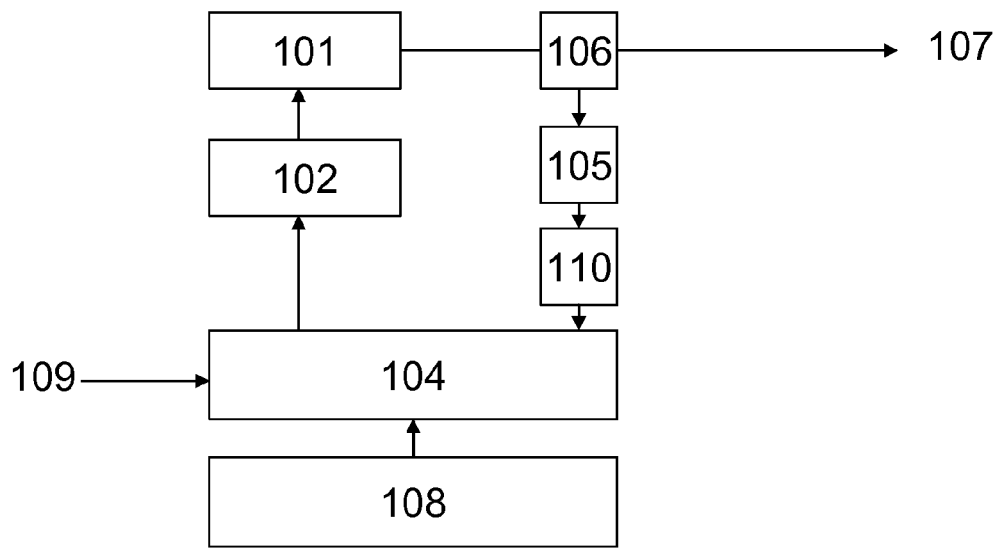
FIG. 2 illustrates a schematic of the implementation of the switching system and method according to the invention.
FIG. 3 illustrates a representation of the lookup table defined in FIG. 2.

In accordance to this invention, an embodiment is shown in FIG. 2 where a tunable laser (101) provides an optical output, which passes through a beam splitter (106) where some of the light emitted is directed to a wavelength reference (105) and the remaining light is directed to an output (107). The output from the wavelength reference (105) is passed to a photodiode and analogue to digital conversion (ADC) module (110). The digital output of the analogue to digital conversion is passed to a processor (104). In addition the processor has a lookup table (108) stored in memory which has the setup values for each wavelength desired of the tunable laser. These values can be set to the laser from the processor by sending them to the digital to analogue converters (102) and then through some conditioning electronics to the laser (101). A request to switch wavelength of the laser (101) can be provided to the processor (104) by means of an electrical interface (109).

In normal operation the processor adjusts control values of the laser so that the measured values from the wavelength reference reach a desired value, normally a specific wavelength of the laser. This is performed by measuring the voltage of the wavelength reference photodiode (105) using an ADC (110), comparing it to a desired value and adjusting the set values of the laser via the DAC (102) to change the ADC value of the wavelength reference so that the value from this is closer to the desired value. This can be performed multiple times and is normally performed at a constant rate and in the form of a proportional control, a proportional and integral control, or a proportional, integral and differential control (P, PI, PID, respectively).

When a request is received by the processor (104) by the electrical interface (109) to switch the wavelength of the laser to a new operating point, or from one channel to a new channel, the processor firstly retrieves the required settings for the new channel from the lookup table (108).

An example of a lookup table is provided in FIG. 3, where a series of values are stored for each channel of wavelength setting of the laser. These values are the bias settings of the tunable laser (201), the fine wavelength control setting of the laser (202), the source compensation factor (203), the destination compensation factor (204) and the channel conversion factor (205).

This lookup table can be generated from a calibration procedure to test various inputs to the laser and measure the output power and wavelength of the laser. From a sequence of these measurements a table can be generated where a set of inputs to the laser correspond to a specific output wavelength and power from the laser device.

In any switching of the laser a predetermined set of values are used to set the destination wavelength. For example, to adjust the wavelength may involve adjusting multiple inputs to the laser or other output characteristics jointly or separately from wavelength, such as optical output power from the laser.

There are three aspects of this invention, either alone or in any combination, which may help to provide ultra-fast switching. The first is a means to lock the output wavelength of the laser using a feedback loop from a wavelength reference such as a Fabry Perot etalon and adjusting the inputs to the laser so that the wavelength adjusts to the desired wavelength. The second is to adjust the destination settings on the laser based on the source channel. The third is to measure the amount of compensation provided by the feedback loop just before the switch and convert this to a similar amount for the new wavelength and carry this compensation across the switch. The conversion compensates for different bias conditions of the laser from one operating point to the new operating point, for example taking into account the tuning efficiency of the laser as at one operating point a 2 GHz error may result in a 5 mA compensation but for another operating point the compensation required to generate a similar wavelength adjustment is 2 mA.

The adjustment applied to the laser from a source to a destination channel is performed by determining the amount of adjustment applied, converting the adjustment applied to a corresponding adjustment at the destination and then adding the adjustment value to the destination channel. Determination of the adjustment value applied will take the difference between the unadjusted settings for the laser stored in the lookup table, and subtract them from the actual laser settings on the laser prior to switching the laser. Consideration should be taken of the source destination compensation which in normal cases should not be considered as part of the adjustment and should be removed from the actual laser settings, or added to the lookup table values, before calculation of the laser adjustment.

The three components mentioned above may help to provide ultra-fast switching such that the wavelength error at the time of switching is small and the feedback loop substantially maintains this small error.

When the processor has retrieved the lookup table values for the new channel these are stored locally in registered titled new values. The previous lookup table values for the current channel are stored in local registered titled old values.

Initially a calculation is performed to determine the new settings for the tunable laser. This is determined by obtaining the source compensation factor for the current channel and summing it with the destination compensation factor for the new channel. This figure is then multiplied by the channel compensation factor of the new channel and added to the fine wavelength control setting of the new operating point or channel.

Figure 4:
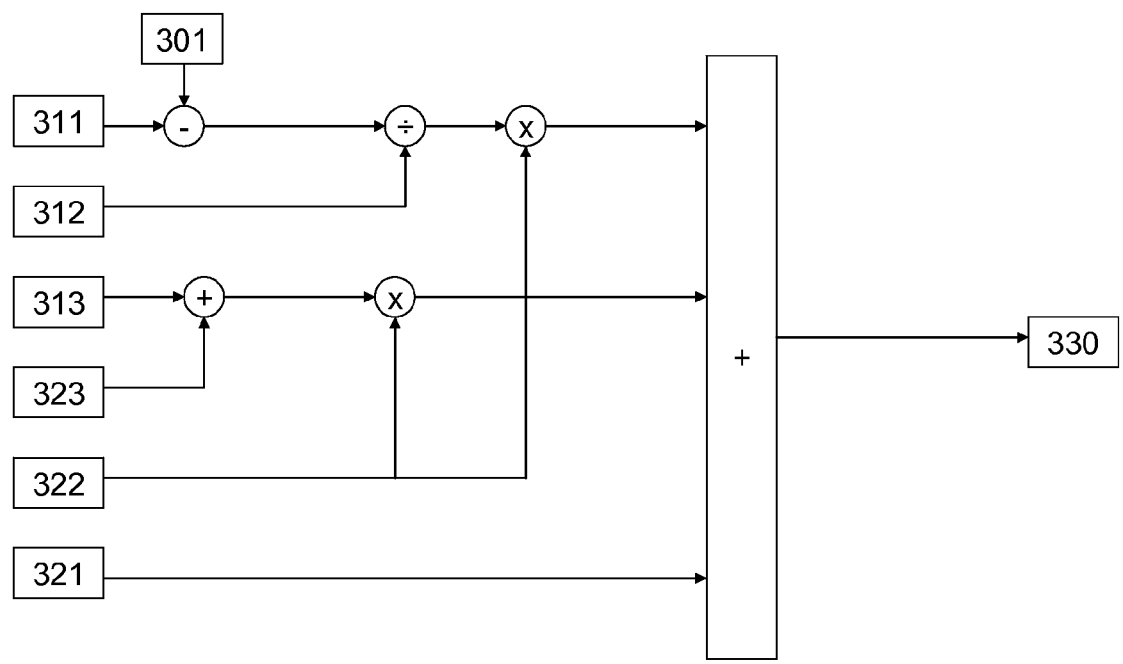
FIG. 4 illustrates a graphical representation of the calculation performed prior to a wavelength switch of the tunable laser.

Then the current fine wavelength control setting is subtracted from the old fine wavelength control value to determine the difference between the old fine wavelength control setting and the current wavelength control setting. This it then divided by the compensation factor of the old channel and multiplied by the compensation factor of the new channel. The result is then added to the fine wavelength control value to be set to the laser. The processor is now prepared to switch to the new channel and performs the steps of:

(a) turn off the feedback control loop
(b) Set the new control values to the tunable laser
(c) turn on the feedback control loop The above system is displayed schematically in FIG. 4 where 301 is the current fine wavelength control setting, 311 is the old fine wavelength control setting, 312 is the old conversion factor, 313 is the old source compensation factor, 323 is the new destination compensation factor, 322 is the new conversion factor and 321 is the new fine control wavelength value. The output (330) is used to set the fine wavelength control value of the laser and after the switch the old conversion factor (312) is updated with the new conversion factor (322), the old fine control wavelength value (311) is updated with the new fine control wavelength value (321), and the old source compensation factor is updated with the new source compensation factor.

The correct scaling of these parameters can ensure that the laser switches to the correct wavelength and the feedback loop ensures that the wavelength then remains at the correct wavelength.

Figure 5:
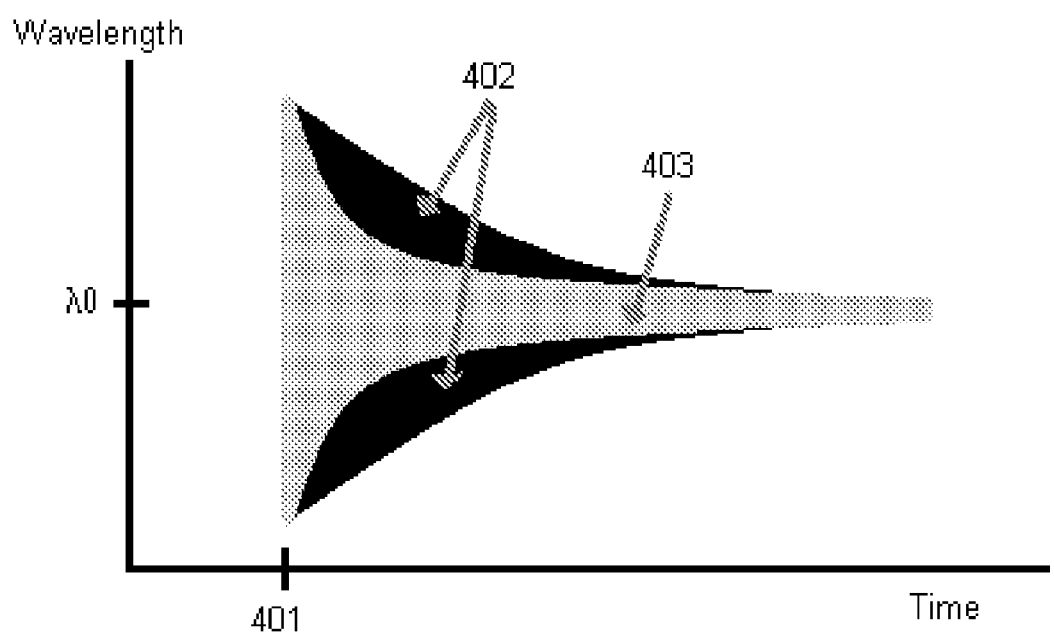
FIG. 5 illustrates the effect of the invention on the wavelength error of the tunable laser.
Figure 5:
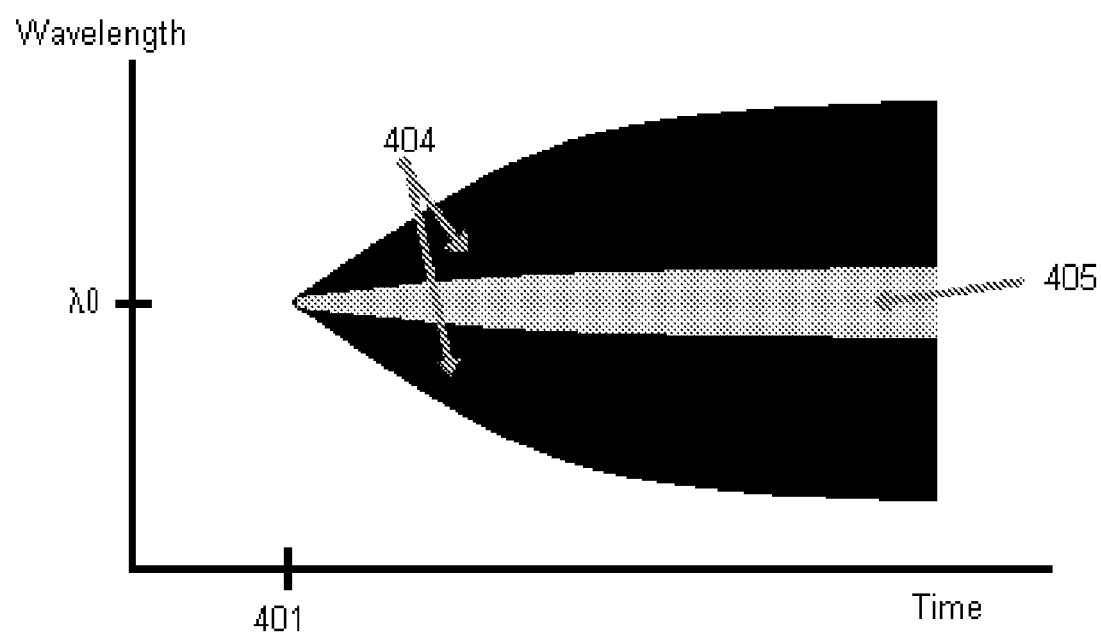

The effect of the invention on the wavelength error is shown in FIG. 5. The switching event is shown at 401 and the wavelength plots as a function of time from any other wavelength to the wavelength shown (lambda0) in the plot. The block region 402 is the possible wavelengths that can occur for each of the source channels without using any locking scheme. Using a feedback loop which compensates for wavelength error will reduce the errors to the grey region 403 but the initial error remains unchanged.

When the locking scheme of this invention is used the black region (404) shows the possible wavelengths of the laser depending on the previous operating point and when the wavelength feedback loop is employed the grey (405) region shows the possible wavelengths of the laser. As can be seen by reducing the initial wavelength spread the locking time of the laser can be greatly reduced. This is achieved by the combination of the three control steps detailed previously. This means that the initial wavelength error is small, but, due to thermal effects, the static wavelength error for these settings may be quite large, as opposed to traditional/conventional techniques which make the static wavelength error small, but this will increase the wavelength error for the period of time just after the wavelength switch while the laser temperature stabilises. The advantage of this is that the laser output can be used much sooner, i.e. just after the wavelength switch, as the instantaneous wavelength error is small, and hence the switching time of the laser is greatly reduced.

It should be noted that preferably the source destination compensation factors are stored in a lookup table. However, alternatively they can be calculated. The effect of these values is to provide an adjustment in destination wavelength dependent on the source. It will be appreciated that this is an important part of what provides the dramatic improvement in switching times of the laser from FIG. 5(a) to FIG. 5(b).

In another preferred embodiment of the invention an analogue feedback loop can be used instead of a digital feedback loop as described above. In this case an additional ADC is required to either measure the additional fine control voltage or current applied by the analogue feedback loop to replace the value calculated by the subtraction of the current fine control value (301) and old fine wavelength control value (311) in the previous embodiment.

In another embodiment the adjustment of the fine control wavelength value of the laser may be just settings to the phase section of the laser, or combinations of multiple sections of the laser according to some defined rules and or equations.

In another preferred embodiment of the invention the signs of each of the inputs to the summation prior to obtaining the fine wavelength control value to set to the laser can be altered dependent on the physical properties of the laser and feedback control used.

The words "comprises/comprising" and the words "having/including" when used herein with reference to the present invention are used to specify the presence of stated features, integers, steps or components but does not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination. It will be further appreciated that the invention can be applied to any type of tunable laser system.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

The invention is not limited to the embodiments hereinbefore described but may be varied in both construction and detail.

I claim:

1. A laser system for switching from a current operating point to a new operating point of a laser, the laser system comprising:
a laser configured to operate at a plurality of wavelengths, and while operating at a given one of the wavelengths, to operate at a plurality of operating points, wherein a plurality of settings define, at least in part, operation of the laser;
a feedback loop configured to adjust one or more of the settings of the laser based on a reference value;
a source channel and a destination channel; and
a processor and program instructions that are stored in a non-transitory computer-readable medium and executable by the processor to:
transfer one or more adjustments caused to the settings of the laser by the feedback loop from the source channel to the destination channel; and
utilise a compensation factor based on the source and destination channels to adjust one or more destination channel settings to thereby switch from current operating point of the laser to new operating point of the laser, wherein the compensation value includes compensation for thermal effects of the laser.

2. The laser system as claimed in claim 1 wherein the feedback loop is configured to lock the operation of laser to a given wavelength.

3. The laser system as claimed in claim 1 wherein the feedback loop comprises a digital feedback loop.

4. The laser system as claimed in claim 1 wherein the feedback loop comprises an analogue feedback loop.

5. The laser system as claimed in claim 1 wherein the reference value comprises a wavelength reference, wherein the wavelength reference comprises a Fabry Perot etalon to provide a correction factor for the feedback loop.

6. The laser system as claimed in claim 1 wherein the laser comprises a phase section, and wherein a selection of the one or more of the settings of the laser to be adjusted by the feedback loop is determined, at least in part, by the phase section of the laser.

7. The laser system as claimed in claim 1 wherein the compensation factor compensates for one or more bias conditions of the laser.

8. The laser system as claimed in claim 1 wherein a lookup table stores a series of values for each channel of wavelength of the laser, said values comprising one or more of bias settings, a fine wavelength control setting, a source compensation factor, a destination compensation factor or a channel conversion factor.

9. The laser system as claimed in claim 8 further comprising program instructions that are stored in the non-transitory computer-readable medium and executable by the processor to determine the new operating point, the program instructions executable to:
obtain the source compensation factor for the current channel and sum the source compensation factor with the destination compensation factor for a new channel; and
multiply the sum of the source compensations factor and destination compensation factor by the channel compensation factor of the new channel and add the resulting value to the fine wavelength control setting of the new channel.

10. A method of switching a laser from a current operating point to a new operating point, wherein the laser is operating at a particular wavelength, the method comprising:
enabling a feedback loop for adjusting one or more settings of the laser based on a reference value;
transferring one or more adjustments caused to the one or more settings of the laser by the feedback loop from a source channel to a destination channel; and
utilising a compensation factor based on the source channel and the destination channel adjust one or more destination channel settings, wherein the compensation value includes compensation for thermal effects of the laser.

11. The method of claim 10 wherein adjusting settings of the laser based on the reference value comprises locking the wavelength at which the laser operates.

12. The method of claim 10 further comprising determining the one or more settings of the laser to be adjusted by the feedback loop, wherein the determination is based, at least in part, on a phase section of the laser.

13. The method of claim 10 further comprising using the compensation factor to compensate for one or more bias conditions of the laser.

14. The method of claim 13 wherein using the compensation factor to compensate for one or more bias conditions of the laser further comprises referencing a lookup table that stores a series of values for each channel of wavelength of the laser, said values comprising one or more of bias settings, a fine wavelength control setting, a source compensation factor, a destination compensation factor or a channel conversion factor.

15. The method of claim 14 wherein utilising the compensation factor based on the source channel and the destination channel to adjust one or more destination channel settings comprises:
   determining the new operating point by:
      obtaining the source compensation factor for the current channel and sum the source compensation factor with the destination compensation factor for a new channel; and
      multiplying the sum of the source compensations factor and destination compensation factor by the channel compensation factor of the new channel and adding the resulting value to the fine wavelength control setting of the new channel.

16. A non-transitory computer-readable medium comprising program instructions for operating a laser system, wherein the program instructions are executable by a processor to:
   enable a feedback loop to adjust settings of a laser based on a reference value;
   transfer any adjustment caused to the settings of the laser by the feedback loop from a source to a destination channel; and
   utilise a compensation factor based on the source and destination channels to adjust one or more destination channel settings to thereby switch from a current operating point of the laser to a new operating point of the laser, wherein the compensation factor includes compensation for thermal effects of the laser.

* * * * *

UNITED STATES PATENT AND TRADEMARK OFFICE
CERTIFICATE OF CORRECTION

PATENT NO.         : 7,924,893 B2
APPLICATION NO.    : 12/202191
DATED              : April 12, 2011
INVENTOR(S)        : Thomas Farrell It is certified that error appears in the above-identified patent and that said Letters Patent is hereby corrected as shown below:

In Col. 1, line 36, please delete "The phase section," and substitute therefore --The optical path length of the cavity can also be tuned with the phase section,--

Signed and Sealed this
Sixteenth Day of August, 2011

David J. Kappos
*Director of the United States Patent and Trademark Office*